(12) United States Patent
Sugimura et al.

(10) Patent No.: US 7,306,676 B2
(45) Date of Patent: *Dec. 11, 2007

(54) APPARATUS FOR MANUFACTURING SEMICONDUCTOR SINGLE CRYSTAL

(75) Inventors: Wataru Sugimura, Tokyo (JP);
Toshiaki Ono, Tokyo (JP); Masataka Hourai, Tokyo (JP)

(73) Assignee: Sumco Corporation, Tokyo (JP)

( * ) Notice: Subject to any disclaimer, the term of this patent is extended or adjusted under 35 U.S.C. 154(b) by 11 days.

This patent is subject to a terminal disclaimer.

(21) Appl. No.: 11/328,099

(22) Filed: Jan. 10, 2006

(65) Prior Publication Data

US 2006/0283381 A1    Dec. 21, 2006

Related U.S. Application Data

(60) Provisional application No. 60/693,946, filed on Jun. 27, 2005.

(30) Foreign Application Priority Data

Jun. 20, 2005   (JP)   ............................. 2005-180002

(51) Int. Cl.
*C30B 35/00* (2006.01)

(52) U.S. Cl. ...................... 117/208; 117/217; 117/218; 117/222

(58) Field of Classification Search ................ 117/208, 117/217, 218, 222, 900
See application file for complete search history.

(56) References Cited

FOREIGN PATENT DOCUMENTS

| JP | 61-178495 A | 8/1986 |
|----|-------------|--------|
| JP | 11-189495 A | 7/1999 |
| JP | 2000-281491 A | 10/2000 |
| JP | 2001-335396 A | 12/2001 |
| JP | 2004-182525 A | 7/2004 |
| JP | 2004-217460 A | 8/2004 |

*Primary Examiner*—Felisa Hiteshew
(74) *Attorney, Agent, or Firm*—Pillsbury Winthrop Shaw Pittman, LLP

(57) ABSTRACT

This apparatus for manufacturing a semiconductor single crystal includes: a crucible; a heater; a crucible driving unit; a chamber for housing the crucible and the heater; and a hydrogen mixed gas supplying device for supplying into the chamber a hydrogen mixed gas including an inert gas in admixture with a hydrogen-containing gas that contains hydrogen atoms, wherein the hydrogen mixed gas supplying device includes: a hydrogen-containing gas supply unit; an inert gas supply unit; a hydrogen-containing gas flow rate controller; an inert gas flow rate controller; and a buffer tank for mixing together the hydrogen-containing gas and the inert gas so as to form a hydrogen mixed gas and for holding the hydrogen mixed gas.

13 Claims, 5 Drawing Sheets

APPARATUS FOR MANUFACTURING SEMICONDUCTOR SINGLE CRYSTAL

BACKGROUND OF THE INVENTION

1. Field of the Invention

The present invention relates to an apparatus for manufacturing a semiconductor single crystal in a hydrogen-containing atmosphere.

This application claims priority from Japanese Patent Application No. 2005-180002, filed on Jun. 20, 2005, and U.S. Provisional Patent Application No. 60/693,946, filed on Jun. 27, 2005, the contents of which are incorporated herein by reference.

2. Background Art

A silicon single crystal, which is one type of semiconductor single crystal, is manufactured by using a heater to heat a polycrystalline silicon starting material held in a crucible within an airtight chamber so as to form a silicon melt, and growing a silicon single crystal while pulling it from the silicon melt by the Czochralski (CZ) method. The resulting silicon ingot is sliced to prepare silicon wafers, and chips such as integrated circuits are fabricated on the silicon wafers.

An inert gas (primarily argon gas) has hitherto been used as the atmosphere within the chamber when pulling such a silicon single crystal. The reason for using the inert gas is to inhibit chemical reactions between the silicon melt, the chamber members and the growing silicon ingot, thereby avoiding the entry of byproduct-forming impurities. In addition, when supplying a large amount of gas, a flow of gas within the chamber arises. By utilizing the flow of gas within the chamber, metal contamination can be avoided, enabling a silicon single crystal of higher quality to be achieved.

The effectiveness of admixing a very small amount of hydrogen gas in the atmosphere within such a chamber has recently began to be reported (see, for example, Patent Documents 1 to 4). According to the art disclosed in these Patent Documents, the hydrogen atoms act on grown-in defects, particularly void defects such as crystal oriented particles (COP), that have been introduced into the crystal, thereby being able to shrink or eliminate void defects in much the same way as nitrogen doping of the silicon melt.

Known techniques for safely supplying hydrogen gas, which is flammable, into such a chamber include a method for specifying a hydrogen concentration using a triangular diagram (Patent Document 5), and method for supplying hydrogen gas so as to efficiently dissolve hydrogen atoms into a silicon melt (Patent Document 6).

However, the prior-art method for supplying hydrogen gas into a chamber described in Patent Document 6 is a method for supplying hydrogen mixed gas which uses a hydrogen gas supplying device that stores beforehand in a cylinder or the like an amount of hydrogen mixed gas required for at least one pull of a silicon single crystal in a hydrogen atmosphere. In such a prior-art method for supplying hydrogen mixed gas, because a content of hydrogen atoms in the hydrogen mixed gas is predetermined, it is very difficult to optimally control the hydrogen concentration in response to changes in a crystal pulling environment during pulling of the silicon single crystal. Hence, it is a challenge to achieve the maximum benefits of pulling a silicon single crystal in a hydrogen atmosphere.

Also, because an apparatus for manufacturing a silicon single crystal having a large diameter that uses several hundred liters or more per minute of such a hydrogen mixed gas would require a hydrogen mixed gas storage means of a quite considerable size, there is some concern that such a prior-art arrangement would entail high equipment costs. An additional concern is the difficulty of continuously and stably supplying hydrogen mixed gas into the chamber at a high flow rate over a period of several days during a single pull.

Patent Document 1: Japanese Unexamined Patent Application, First Publication No. S61-178495

Patent Document 2: Japanese Unexamined Patent Application, First Publication No. H11-189495

Patent Document 3: Japanese Unexamined Patent Application, First Publication No. 2000-281491

Patent Document 4: Japanese Unexamined Patent Application, First Publication No. 2001-335396

Patent Document 5: Japanese Unexamined Patent Application, First Publication No. 2004-182525

Patent Document 6: Japanese Unexamined Patent Application, First Publication No. 2004-217460

SUMMARY OF THE INVENTION

It is therefore an object of the invention to provide an apparatus for manufacturing a semiconductor single crystal which can easily control the hydrogen atom concentration within a hydrogen mixed gas in response to changes in a semiconductor single crystal pulling environment and which can continuously and stably supply the hydrogen-containing gas using a low-cost equipment over an extended period of time.

Accordingly, the present invention provides an apparatus for manufacturing a semiconductor single crystal, the apparatus includes: a crucible for holding a semiconductor melt; a heater for heating the crucible; a crucible driving unit for rotating and/or vertically moving the crucible; a chamber for housing the crucible and the heater; and a hydrogen mixed gas supplying device for supplying into the chamber a hydrogen mixed gas including an inert gas in admixture with a hydrogen-containing gas that contains hydrogen atoms, wherein the hydrogen mixed gas supplying device comprises: a hydrogen-containing gas supply unit for supplying the hydrogen-containing gas that contains hydrogen atoms; an inert gas supply unit for supplying the inert gas; a hydrogen-containing gas flow rate controller for controlling a flow rate of the hydrogen-containing gas supplied by the hydrogen-containing gas supply unit; an inert gas flow rate controller for controlling a flow rate of the inert gas supplied by the inert gas supply unit; and a buffer tank for mixing together the hydrogen-containing gas and the inert gas that flow respectively from the hydrogen-containing gas flow rate controller and the inert gas flow rate controller so as to form a hydrogen mixed gas and for holding the hydrogen mixed gas.

The buffer tank is included and a fixed amount of hydrogen mixed gas is constantly held in the buffer tank, and an internal pressure within the buffer tank is constantly controlled to a pressurized state within a selected pressure range. Thereby, when the flow rate of the hydrogen-containing gas or the inert gas is changed so as to control the hydrogen partial pressure during the pulling of a silicon single crystal ingot (semiconductor single crystal), the buffer tank acts as a pressure adjustment buffering means which is capable of greatly moderating fluctuations in pressure. As a result, even when the hydrogen partial pressure is changed, abrupt pressure fluctuations do not arise within the chamber, thus providing a configuration that is very effective for stably pulling a silicon single crystal ingot.

The pulled silicon single crystal ingot can be roughly divided, along the pulling direction, into a neck portion, a body portion and a tail portion. During pulling of the ingot, the hydrogen concentration (hydrogen partial pressure) of the hydrogen mixed gas supplied to the chamber can be varied in accordance with the properties particular to these respective portions. In this way, it is possible to achieve in the body portion an effect of shrinking sizes of COP defects and an effect of inhibiting a formation of dislocation defects, and to thereby form within the silicon single-crystal ingot a good body portion having few defects. When installing equipment such as the hydrogen-containing gas supply unit and a hydrogen line in an outdoor location, such a configuration can reduce the hazards associated with a system that contains high-pressure hydrogen-containing gas. As used herein, "neck portion" refers collectively to a portion of the ingot which is pulled just before the body portion, such as a portion in which necking is carried out, a diameter expansion portion which is commonly referred to as the "shoulder" and the like. Pulling the silicon single-crystal ingot in a hydrogen-containing atmosphere increases a controllability of a ratio of V/G between a pull rate V and an axial temperature gradient G with respect to the V and the G, and increases a controllability with respect to a distribution of defects, such as COPs, oxygen-induced stacking faults having a ring-like distribution (R-OSF) and transition clusters, within the single crystal.

The semiconductor melt may be a silicon melt and the semiconductor single crystal may be a silicon single crystal. The buffer tank may be equipped with a buffer tank pressure sensor for detecting an internal pressure within the tank. Also, the buffer tank may be equipped with a tank inflow valve on an inflow side thereof. In the buffer tank, a total flow rate on the inflow side may be set higher than a total flow rate on an outflow side, and when an internal pressure within the buffer tank exceeds an upper limit value in a preset pressure range, a control may be carried out so as to close the tank inflow valve until the internal pressure within the tank falls to at least a lower limit value in the preset pressure range.

According to this aspect of the present invention, because the total flow rate of the gases entering the buffer tank has been set to a value higher than the flow rate of the gas leaving the buffer tank, the internal pressure of the buffer tank is controlled so as to always be in a pressurized state and the internal pressure can be held within a fixed range.

The apparatus for manufacturing a semiconductor single crystal of the present invention may further include a chamber internal pressure detecting unit for detecting an internal pressure within the chamber, and wherein the flow rate of the hydrogen-containing gas allowed by the hydrogen-containing gas flow rate controller may be controlled in accordance with an internal pressure value within the chamber detected by the chamber internal pressure detecting unit. The apparatus for manufacturing a semiconductor single crystal of the present invention may further include a semiconductor single crystal pull rate detecting unit for detecting a pull rate of the semiconductor single crystal being pulled from the semiconductor melt, and wherein the flow rate of the hydrogen-containing gas allowed by the hydrogen-containing gas flow rate controller may be controlled in accordance with a pull rate value for the semiconductor single crystal. The apparatus for manufacturing a semiconductor single crystal of the present invention may further include a semiconductor single crystal length detecting unit for detecting a length of the semiconductor single crystal already pulled from the semiconductor melt, and wherein the flow rate of the hydrogen-containing gas allowed by the hydrogen-containing gas flow rate controller may be controlled in accordance with the length of the pulled semiconductor single crystal.

The admixture of hydrogen in the melt (semiconductor melt) can be controlled by means of the hydrogen partial pressure near a surface of the melt in accordance with Henry's law. Specifically, in the present invention, when the pressure within the furnace changes during pulling, it is possible to carry out a control which either holds the hydrogen partial pressure constant or actively changes the hydrogen partial pressure. By controlling the hydrogen partial pressure with respect to the melt, the influence of hydrogen atoms on the single crystal can be controlled so as to achieve an optimal state.

First, a seed crystal is brought into contact with the semiconductor melt (e.g., silicon melt) and is pulled to a given length at a small diameter so as to prevent dislocation defects. Next, when pulling to form a neck portion in which the ingot diameter widens out to a specific predetermined value, a control to include or exclude a hydrogen-containing gas component in the gas supplied to the chamber is carried out by an ON/OFF control of a hydrogen-containing gas flow rate controller. By carrying out the control to include or exclude the hydrogen-containing gas component at the neck portion, a number of effects can be achieved. These effects include lowering iron contamination from the chamber and other members making up the puller, stabilizing the surface of the silicon melt by the presence of a very small amount of hydrogen-containing gas (a flow-regulating effect), and reducing thermal shock when the seed crystal is brought into contact with the silicon melt. Also, the ON/OFF control of the hydrogen-containing gas component at the neck portion improves the crystal characteristics in a body portion of the ingot that follows the neck portion. Moreover, by pulling the crystal in a hydrogen atmosphere, the formation of dislocations is prevented from occurring at the neck portion, thus making it possible to avoid repetition of the pulling process (melt-back) and effectively lowering the production costs for silicon single-crystal ingots.

While the body portion of the silicon single-crystal ingot (semiconductor single crystal) is being pulled, the hydrogen-containing gas flow rate controller varies the flow rate of the hydrogen-containing gas based on flow rate control signals sent from a control unit, thereby controlling the hydrogen partial pressure of the hydrogen mixed gas supplied to the chamber. Through a control based on the pull rate (fp) (furnished by a pull rate detecting unit), a control based on the internal pressure within the chamber (furnished by a chamber internal pressure detecting unit), or a control based on the length of the pulled crystal (furnished by a crystal length detecting unit), an effect of shrinking sizes of COP defects and an effect of inhibiting a formation of dislocation defects can be obtained in the body portion, enabling the formation of a good body portion of the silicon ingot having few defects. At the same time, it is possible to control the hydrogen partial pressure with respect to the melt and thereby control the influence of hydrogen atoms on the single crystal so as to achieve an optimal state.

The inert gas may include at least argon as a primary component. The hydrogen-containing gas supply unit may include a hydrogen-containing gas purification equipment for purifying a starting gas containing hydrogen atom. The inert gas supply unit may include an inert gas purification equipment for purifying a starting gas containing inert gas. The hydrogen mixed gas supplying device may have a plurality of hydrogen mixed gas supply lines for supplying the hydrogen mixed gas to a plurality of the above-described chambers. If the hydrogen mixed gas supplying device is supplied in combination with a gas other than the hydrogen gas and the inert gas, control may be carried out so as to combine the hydrogen gas and the other gas, to combine the hydrogen gas, inert gas and the other gas or to switch to and supply respectively one or more of these gases. At least an inner wall of the chamber may be made of a material that is resistant to hydrogen corrosion. This makes it possible to prevent corrosion and deterioration of the chamber even when the interior of the chamber is exposed to an atmosphere containing active hydrogen.

The apparatus for manufacturing a semiconductor single crystal of the present invention makes it possible to change the hydrogen concentration (hydrogen partial pressure) of the hydrogen mixed gas supplied to the chamber in accordance with the properties particular to the respective portions of a silicon single crystal ingot (semiconductor single crystal) pulled in a hydrogen atmosphere. This allows the effect of shrinking sizes of COP defects and the effect of inhibiting a formation of dislocation defects to be achieved in the body portion of the ingot, enabling a good body portion of the silicon ingot having few defects to be formed. By installing equipment such as the hydrogen-containing gas supply unit and a hydrogen line in an outdoor location, such a configuration can reduce the hazards associated with a system that contains high-pressure hydrogen-containing gas.

BRIEF DESCRIPTION OF THE DIAGRAMS

PREFERRED EMBODIMENTS

Figure 1:
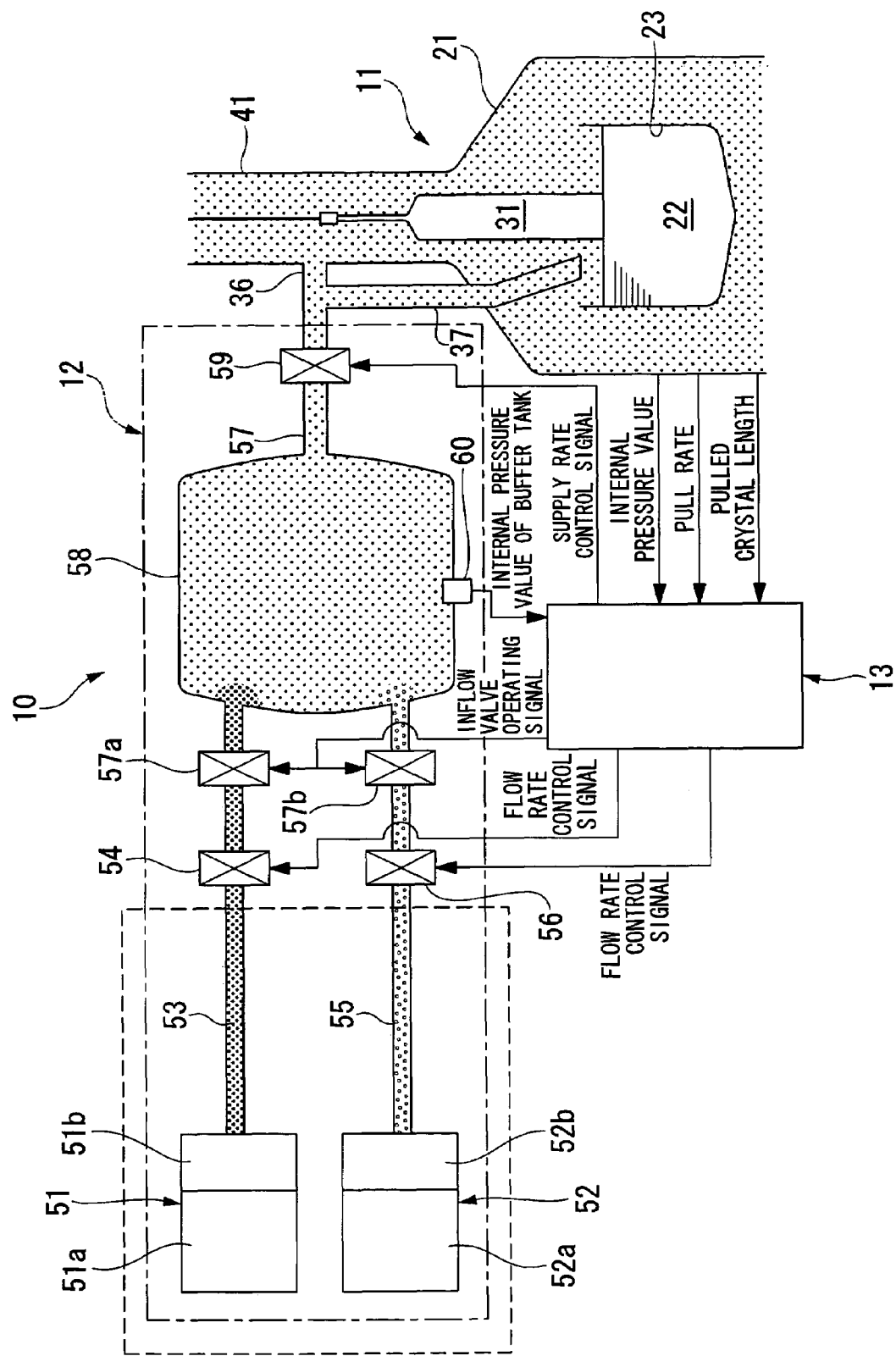
FIG. 1 is a schematic diagram of an apparatus for manufacturing a semiconductor single crystal according to the present invention.

An apparatus for manufacturing a silicon single crystal is described below as one embodiment of the apparatus for manufacturing a semiconductor single crystal of the present invention. In the description, reference is made to FIG. 1, which is an overall schematic diagram of an apparatus for manufacturing a semiconductor single crystal (in this embodiment, a silicon single crystal) according to the present invention, and to FIG. 2, which is a cross-sectional side view of the chamber in FIG. 1. In this embodiment, the apparatus for manufacturing a silicon single crystal (semiconductor single crystal) 10 basically includes a puller 11, a hydrogen mixed gas supplying device 12 and a control unit 13. The puller 11 includes a chamber 21, a quartz crucible (crucible) 23 in which a silicon melt (semiconductor melt) 22 is held and which is placed within the chamber 21, a sidewall heater 24 for heating the quartz crucible 23, a thermal insulation 25 and a crucible driving unit 26.

The quartz crucible 23 includes an approximately cylindrical crucible body 23a that is open at the top and a crucible base 23b that closes the crucible body 23a at the bottom thereof. An outer wall of the quartz crucible 23 is supported by a graphite susceptor (crucible support) 27. The quartz crucible 23 is attached at a bottom face thereof through the graphite susceptor 27 to a top end of a support shaft 28, and the support shaft 28 is in turn connected at a bottom thereof to a crucible driving unit 26. A sidewall heater is disposed circumferentially outside the body 23a of the quartz crucible 23, with the graphite susceptor 27 disposed therebetween.

The sidewall heater 24 for heating the quartz crucible 23 is typically formed cylindrically so as to encircle the quartz crucible 23, and heats the quartz crucible 23. A tubular thermal insulation 25 is provided between the sidewall heater 24 and the chamber 21 so as to surround the sidewall heater 24.

The crucible driving unit 26 has a first rotary motor (not shown) which rotates the quartz crucible 23 and a lifting motor (not shown) which raises and lowers the quartz crucible 23. These motors enable the quartz crucible 23 to be rotated in a given direction and to be moved vertically.

In particular, the lifting motor is designed to raise the quartz crucible 23 with respect to an amount of the decreasing silicon melt 22 so as to maintain at a predetermined level within the chamber 21a surface 22a of the silicon melt (semiconductor melt) 22 which drops as pulling of the silicon single-crystal ingot (semiconductor single-crystal ingot) 31 proceeds.

The chamber 21 is provided at a top thereof with a cylindrical casing 41 of narrower diameter than a rest of the chamber 21. A pull head 42 which is horizontally rotatable is provided at a top end of the casing 41, and a wire cable 43 is suspended from the pull head 42 toward a center of rotation of the quartz crucible 23. It is desirable for all of the chamber 21 or at least an inner side thereof to be made of, or coated with, a material which is resistant to corrosion by highly active hydrogen.

Although not shown in the diagrams, the pull head 42 has built therein a second rotary motor which rotates the pull head 42 and a pulling motor which reels in or pays out the wire cable 43. A seed crystal 33 for dipping in the silicon melt 22 and pulling up the silicon single-crystal ingot 31 is attached by a holder 34 to a bottom end of the wire cable 43.

The chamber 21 has formed at the upper portion thereof a first inlet 36 that is connected to a hydrogen mixed gas supplying device 12, the construction of which will be described later in detail, and introduces a hydrogen mixed gas into the chamber 21 from the casing 41. A second inlet 37, which is similarly connected to the hydrogen mixed gas supplying device 12 and extends from the upper portion of the chamber 21 toward a vicinity of the quartz crucible 23, introduces the hydrogen mixed gas to the vicinity of the quartz crucible 23. The first inlet 36 and the second inlet 37 may be simply pipes with an open end directed into the chamber 21. In addition, the chamber 21 has formed at a lower portion thereof an outlet 39 which discharges gas from within the chamber 21. The amount of gas discharged through this discharge outlet 39 is made the same as the amount of hydrogen mixed gas introduced through the first inlet 36 and the second inlet 37, thereby keeping the pressure within the chamber 21 constant.

Figure 2:
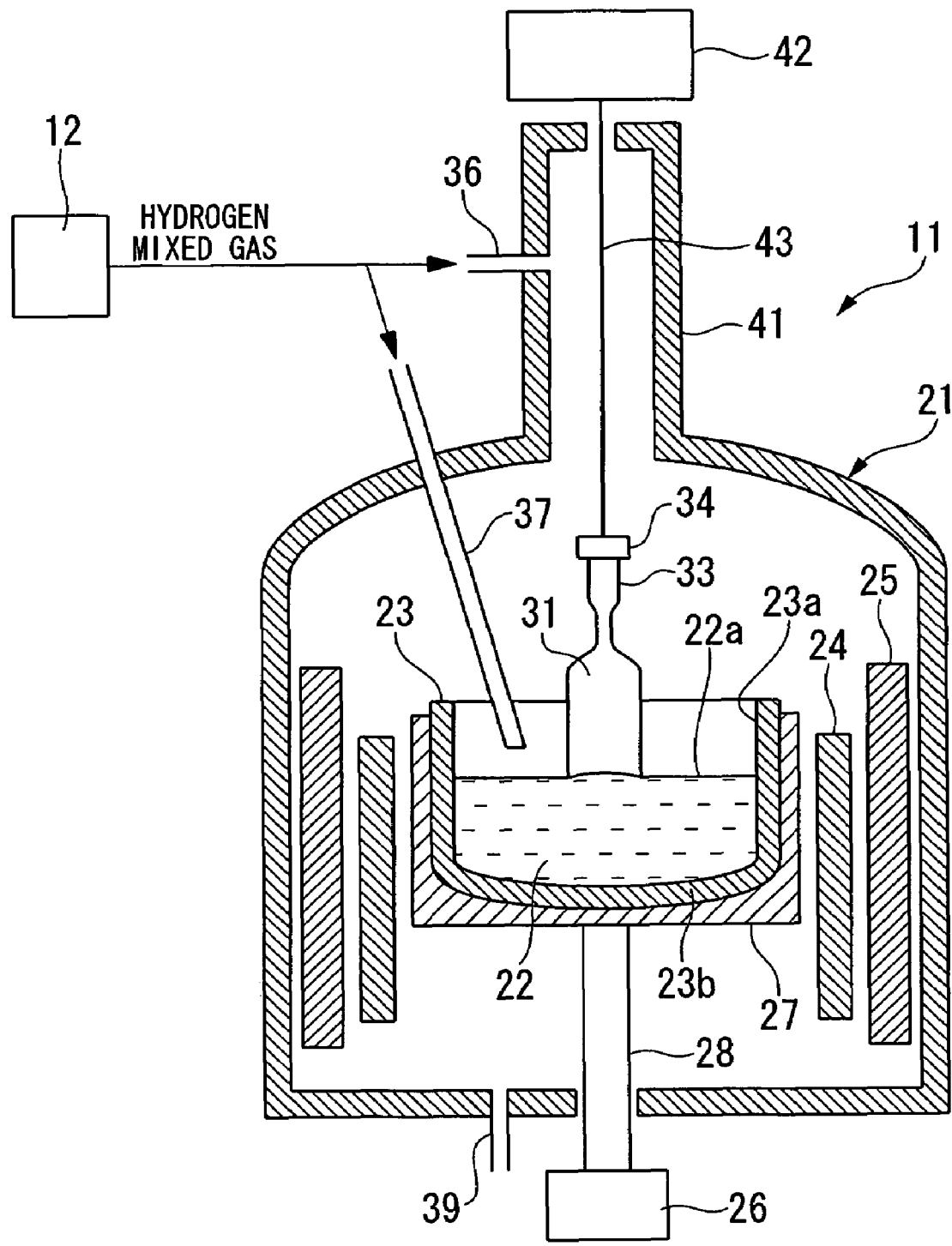
FIG. 2 is a cross-sectional side view of a portion of the chamber in FIG. 1.

Referring to FIG. 1, the hydrogen mixed gas supplying device 12 includes a hydrogen-containing gas supply unit 51 and an inert gas supply unit 52. The hydrogen-containing gas supply unit 51 includes a hydrogen-containing gas source 51a and a hydrogen-containing gas purifier (hydrogen-containing gas purification equipment) 51b for purifying the hydrogen-containing gas. The hydrogen-containing gas source 51a is a source that supplies a starting gas such as hydrogen gas or a gas of a hydrogen atom-containing compound. Exemplary hydrogen-containing gases include hydrogen gas, hydrogen atom-containing inorganic compounds such as $H_2O$ and HCl, silane gases and hydrogen atom-containing organic compounds such as hydrocarbons (e.g., $CH_4$, $C_2H_2$), alcohols, and carboxylic acids.

If the hydrogen-containing gas is hydrogen gas, the hydrogen-containing gas source 51a may be a liquefied hydrogen gas apparatus, a hydrogen-generating apparatus that generates hydrogen from a compound, or a hydrogen-extracting apparatus that extracts hydrogen which has been stored in a hydrogen storing alloy. If the hydrogen-containing gas is the gas of the hydrogen atom-containing compound, the hydrogen-containing gas source 51a may be an apparatus which stores the compound in a liquid state, or a conversion apparatus which synthesizes the hydrogen atom-containing compound. Such a liquefied hydrogen gas apparatus or a compound storing apparatus serves as a source for stably supplying a large amount of hydrogen gas or the gas of the hydrogen atom-containing compound over an extended period of time.

The hydrogen-containing gas purifier 51b provided adjacent to the hydrogen-containing gas source 51a purifies the hydrogen-containing gas supplied as a starting gas by the hydrogen-containing gas source 51a, and supplies a hydrogen-containing gas from which impurities have been removed. This hydrogen-containing gas purifier 51b may be constructed so as to purify and extract the hydrogen from spent hydrogen mixed gas which has already been supplied to the chamber 21 of the puller 11, circulated and returned, and thereby generate a hydrogen-containing gas that is free of impurities. If the hydrogen-containing gas source 51a supplies a hydrogen-containing gas that is free of impurities, such a hydrogen-containing gas purifier 51b may not be needed.

The inert gas supply unit 52 includes an inert gas source 52a and an inert gas purifier (inert gas purification equipment) 52b for purifying the inert gas. The inert gas source 52a is a rare gas supplying source. The inert gas is preferably low-cost argon gas, although various other rare gases such as helium, neon, krypton and xenon may be used singly or in admixture.

The inert gas source 52a may be a liquefied inert gas apparatus or an inert gas-generating apparatus which extracts inert gas. Such a liquefied inert gas apparatus or an inert gas-generating apparatus serves as a source for stably supplying a large amount of inert gas over an extended period of time.

The inert gas purifier 52b provided adjacent to the inert gas source 52a purifies the inert gas supplied as a starting gas by the inert gas source 52a, and supplies an inert gas from which impurities have been removed. This inert gas purifier 52b may be constructed so as to purify and extract the inert gas from spent hydrogen mixed gas which has already been supplied to the chamber 21 of the puller 1. If the inert gas source 52a supplies an inert gas that is free of impurities, such an inert gas purifier 52b may not be needed.

The hydrogen-containing gas supplied by the hydrogen-containing gas supply unit 51 is supplied through a hydrogen line 53. A hydrogen-containing gas flow rate controller (mass flow controller) 54 for controlling the flow rate of the hydrogen-containing gas passing through the hydrogen line 53 is provided on the hydrogen line 53. The hydrogen-containing gas flow rate controller 54 controls the flow rate to a level set by a control unit 13 which controls all the operations in the apparatus for manufacturing a silicon single crystal 10. In addition to the hydrogen-containing gas flow rate controller 54, other components such as a pressure-reducing valve and a check valve may also be provided as appropriate on the hydrogen line 53.

The inert gas supplied by the inert gas supply unit 52 is supplied through an inert gas line 55. An inert gas flow rate controller (mass flow controller) 56 for controlling the flow rate of the inert gas flowing through the inert gas line 55 is provided on the inert gas line 55. The inert gas flow rate controller 56 controls the flow rate to a level set by the control unit 13 which controls all the operations in the apparatus for manufacturing a silicon single crystal 10. In addition to the inert gas flow rate controller 56, other components such as a pressure-reducing valve and a check valve may also be provided as appropriate on the inert gas line 55. In an alternative arrangement, only one or the other of the hydrogen-containing gas flow rate controller 54 and the inert gas flow rate controller 56 may be provided and used alone to adjust the hydrogen concentration in the hydrogen mixed gas.

The hydrogen line 53 that passes through the hydrogen-containing gas flow rate controller 54 and the inert gas line 55 that passes through the inert gas flow rate controller 56 are each connected to a buffer tank 58. In this buffer tank 58, the hydrogen-containing gas and the inert gas are commingled in the same space to form a hydrogen mixed gas. This buffer tank 58 may be a pressure tank having hydrogen corrosion resistance. The buffer tank 58 is provided with a buffer tank pressure sensor 60 which detects an internal pressure within the buffer tank 58 and sends the internal pressure value to the control unit 13. A side from the above-described construction in which the hydrogen line 53 and the inert gas line 55 are each separately connected to the buffer tank 58, the inflow side system into this buffer tank 58 may be alternatively configured so that the hydrogen line 53 and the inert gas line 55 converge into a single line before connecting to the buffer tank 58.

A tank inflow valve 57a is provided on the hydrogen line 53 between the hydrogen-containing gas flow rate controller 54 and the buffer tank 58. Similarly, a tank inflow valve 57b is provided on the inert gas line 55 between the inert gas flow rate controller 56 and the buffer tank 58. These tank inflow valves 57a and 57b on the inflow side of the buffer tank 58 are opened and closed by control signals from the control unit 13 based on the internal pressure value of the buffer tank 58 detected by the buffer tank pressure sensor 60.

A hydrogen mixed gas line 57 which allows the hydrogen mixed gas formed by mixing of the hydrogen-containing gas with the inert gas to flow out of the buffer tank 58 is connected to the buffer tank 58 on the outflow side thereof.

The end of the hydrogen mixed gas line 57 may be connected to the chamber 21 as the first inlet 36 which introduces the hydrogen mixed gas into the chamber 21 from the casing 41 or as the second inlet 37 which introduces the hydrogen mixed gas to the vicinity of the quartz crucible 23 from the upper portion of the chamber 21. These configurations allow the hydrogen mixed gas to be introduced from the casing 41 toward the chamber 21, and allow the hydrogen mixed gas to be introduced into the chamber 21 from the vicinity of the quartz crucible 23. Moreover, the hydrogen mixed gas line 57 may have ends that are connected in parallel to a plurality of chambers of apparatuses for manufacturing a semiconductor single crystal so as to supply the hydrogen mixed gas from a single hydrogen mixed gas supplying device 12 to such a plurality of apparatuses for manufacturing a semiconductor single crystal.

A hydrogen mixed gas flow rate controller (mass flow controller) 59 is provided on the hydrogen mixed gas line 57 that connects the buffer tank 58 and the chamber 21. This hydrogen mixed gas flow rate controller 59 controls the flow rate of hydrogen mixed gas supplied into the chamber 21 through the hydrogen mixed gas line 57 in accordance with supply rate control signals for the hydrogen mixed gas output by the control unit 13. Devices such as a hydrogen concentration meter (not shown) may also be provided as appropriate at this hydrogen mixed gas flow rate controller 59 on the hydrogen mixed gas line 57.

The control unit 13 sends preset flow rate control signals to the hydrogen-containing gas flow rate controller 54 and the inert gas flow rate controller 56 based on data such as an internal pressure of the chamber 21 (obtained by a chamber internal pressure detecting unit), a pull rate for the silicon single-crystal ingot 31 (obtained by a pull rate detecting unit) and a length of the pulled ingot 31 (obtained by a crystal length detecting unit). The hydrogen-containing gas flow rate controller 54 and the inert gas flow rate controller 56 control the flow rates of the hydrogen-containing gas and the inert gas based on these flow rate control signals. Also, inflow valve operating signals are sent to the tank inflow valves 57a and 57b based on the internal pressure values of the buffer tank 58 detected by the buffer tank pressure sensor 60. In addition, supply rate control signals for the hydrogen mixed gas are sent to the hydrogen mixed gas flow rate controller 59.

The apparatus for manufacturing a semiconductor single crystal 10 which includes the hydrogen mixed gas supplying device 12 configured as described above can reduce the hazards associated with a system that contains high-pressure hydrogen-containing gas by installing in an outdoor location an equipment such as the hydrogen-containing gas supply unit 51, the hydrogen line 53 and the buffer tank 58.

Figure 3:
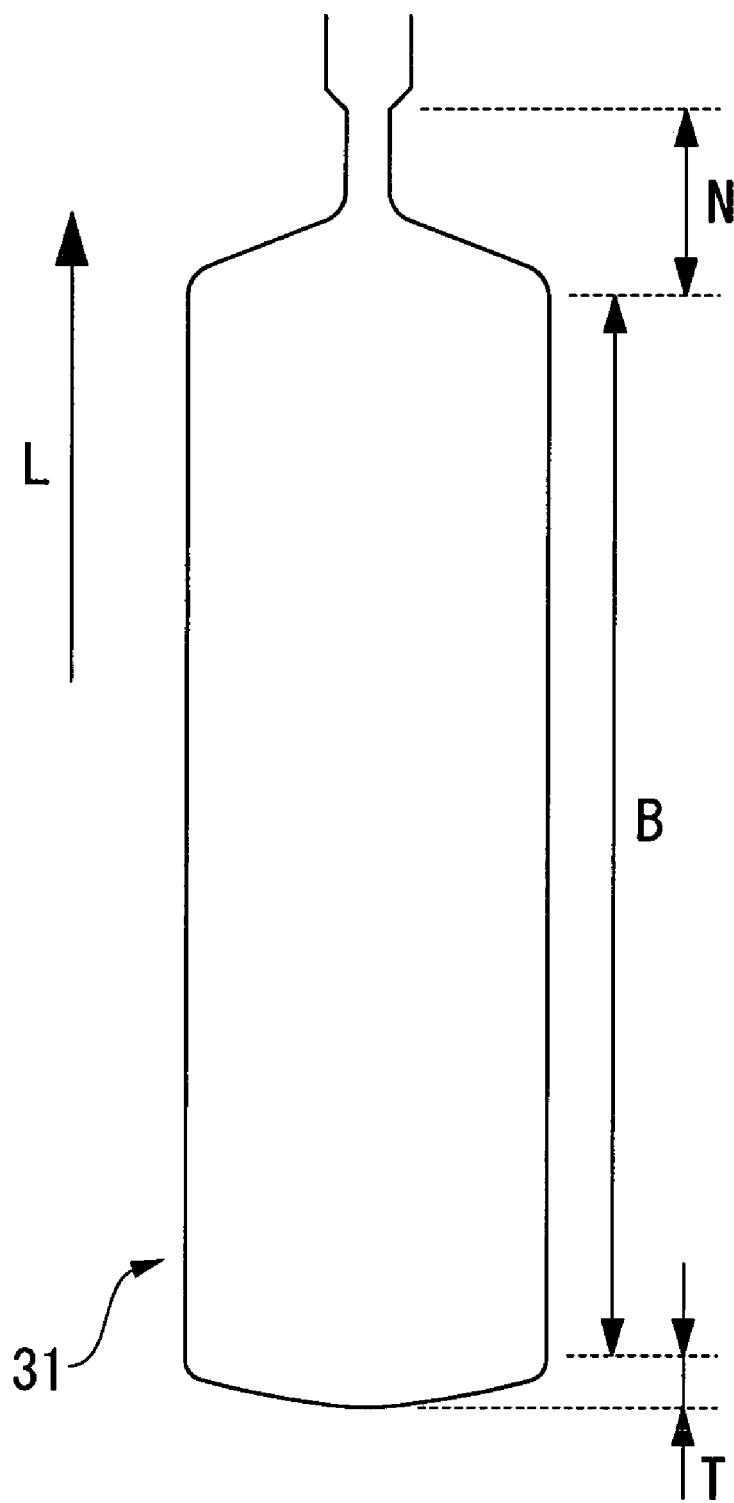
FIG. 3 is a diagram showing portions of a silicon single-crystal ingot.

A description is now given of how hydrogen mixed gas supplied by the hydrogen mixed gas supplying device 12 is controlled in the apparatus for manufacturing a silicon single crystal (apparatus for manufacturing a semiconductor single crystal) of the foregoing construction. FIG. 3 is a side view showing a silicon single-crystal ingot that has been pulled in a hydrogen-containing atmosphere using the apparatus for manufacturing a silicon single crystal of the present invention. The pulled silicon single-crystal ingot 31 can be broadly divided into a neck portion N, a body portion B and a tail portion T along a pulling direction L.

The hydrogen concentration (hydrogen partial pressure) of the hydrogen mixed gas supplied to the chamber is varied in accordance with the properties of each respective portion.

First, the seed crystal is brought into contact with the silicon melt (semiconductor melt) and the single crystal is pulled to a fixed length at a small diameter so as to prevent dislocation defects. Next, when pulling to form the neck portion N in which the crystal diameter widens out to a specific predetermined value, a control to include or exclude a hydrogen-containing gas component in the gas supplied to the chamber 21 is carried out by an ON/OFF control of the hydrogen-containing gas flow rate controller 54 shown in FIG. 1.

By carrying out the control to include or exclude the hydrogen-containing gas component at the neck portion N, a number of effects can be achieved. These include lowering iron contamination from the chamber 21 and other members making up the puller, stabilizing the surface of the silicon melt by the presence of a very small amount of hydrogen-containing gas (a flow-regulating effect), and reducing thermal shock when the seed crystal is brought into contact with the silicon melt. Also, the ON/OFF control of the hydrogen-containing gas component at the neck portion N improves the crystal characteristics in the body portion B of the ingot that follows the neck portion N.

When the body portion B of the silicon single-crystal ingot 31 is pulled, the hydrogen-containing gas flow rate controller 54 changes the flow rate of the hydrogen-containing gas based on flow rate control signals sent by the control unit 13, thereby controlling the hydrogen partial pressure of the hydrogen mixed gas supplied to the chamber.

The hydrogen partial pressure $P(H_2)$ is expressed as follows (when the inert gas is argon).

$$P(H_2) = (\text{pulling pressure/atmospheric pressure}) \times [(H_2 \text{ gas flow rate})/(\text{argon} + H_2 \text{ mixed gas flow rate})] \text{ (Pa)}$$

Letting an optimal hydrogen ($H_2$) partial pressure be Z (Pa) and a defect-free region-forming rate be X (mm/min), hydrogen partial pressure control based on the pull rate (fp) (obtained by a pull rate detecting unit) is carried out under the following conditions:

when the measured fp<X, the hydrogen partial pressure is set to more than Z ($P(H_2)>Z$);

when the measured fp=X, the hydrogen partial pressure is set equal to Z ($P(H_2)=Z$); and when the measured fp>X, the hydrogen partial pressure is set to less than Z ($P(H_2)<Z$).

In hydrogen partial pressure control based on the internal pressure within the chamber (obtained by a chamber internal pressure detecting unit), the $H_2$ gas flow rate and the argon gas flow rate are each controlled in such a way as to keep the above-described optimal hydrogen partial pressure Z (Pa) constant when the internal pressure within the chamber fluctuates.

In hydrogen partial pressure control based on the length of the pulled crystal (obtained by a crystal length detecting unit), control is carried out according to the length of the pulled crystal from the pulling end thereof, expressed as a percentage (%) of the full crystal length (=100%). Letting the optimal $H_2$ hydrogen partial pressure be Z (Pa), hydrogen partial pressure control based on the length of the pulled crystal is carried out under the following conditions:

when the length of the pulled crystal is in a range from the crystal end to 20%, the hydrogen partial pressure is set to more than Z ($P(H_2)>Z$);

when the length of the pulled crystal is in a range from 20 to 30%, the hydrogen partial pressure is set to less than Z ($P(H_2)<Z$); and when the length of the pulled crystal is in a range from 30 to 100%, the hydrogen partial pressure is set equal to Z ($P(H_2)=Z$).

During pulling the body portion B, by controlling the hydrogen partial pressure in the hydrogen mixed gas in accordance with the respective values for pull rate, internal pressure within the chamber or pulled crystal length as described above, an effect of shrinking sizes of COP defects and an effect of inhibiting a formation of dislocation defects can be obtained in the body portion B, thereby enabling the formation of a good body portion of the silicon single-crystal ingot having few defects. For the sake of reference, Table 1 below shows the correlation between the hydrogen concentration (%) and the hydrogen partial pressure (Pa) in hydrogen mixed gas when a silicon single crystal is pulled at an internal pressure of 30 Torr within the chamber.

TABLE 1

| Hydrogen concentration (%) | Hydrogen partial pressure (Pa) |
|---|---|
| 1 | 40 |
| 3 | 120 |
| 6 | 240 |
| 8 | 320 |
| 10 | 400 |

In the formation of the tail portion T in the silicon single crystal ingot 31, a control to include or exclude a hydrogen-containing gas component in the gas supplied to the chamber 21 is carried out by an ON/OFF control of the hydrogen-containing gas flow rate controller 54. This minimizes the return of ingots due to polycrystallization within the ingot during pulling; thereby an optimal tale portion can be formed.

A control is carried out so that the maximum hydrogen concentration in this hydrogen mixed gas is from 1 to 8%. By having the hydrogen concentration in the hydrogen mixed gas fall within a range of 1 to 8%, the combustible range of flammable hydrogen gas can be reliably avoided, enabling the hydrogen-containing gas to be safely introduced into the chamber.

Figure 4:
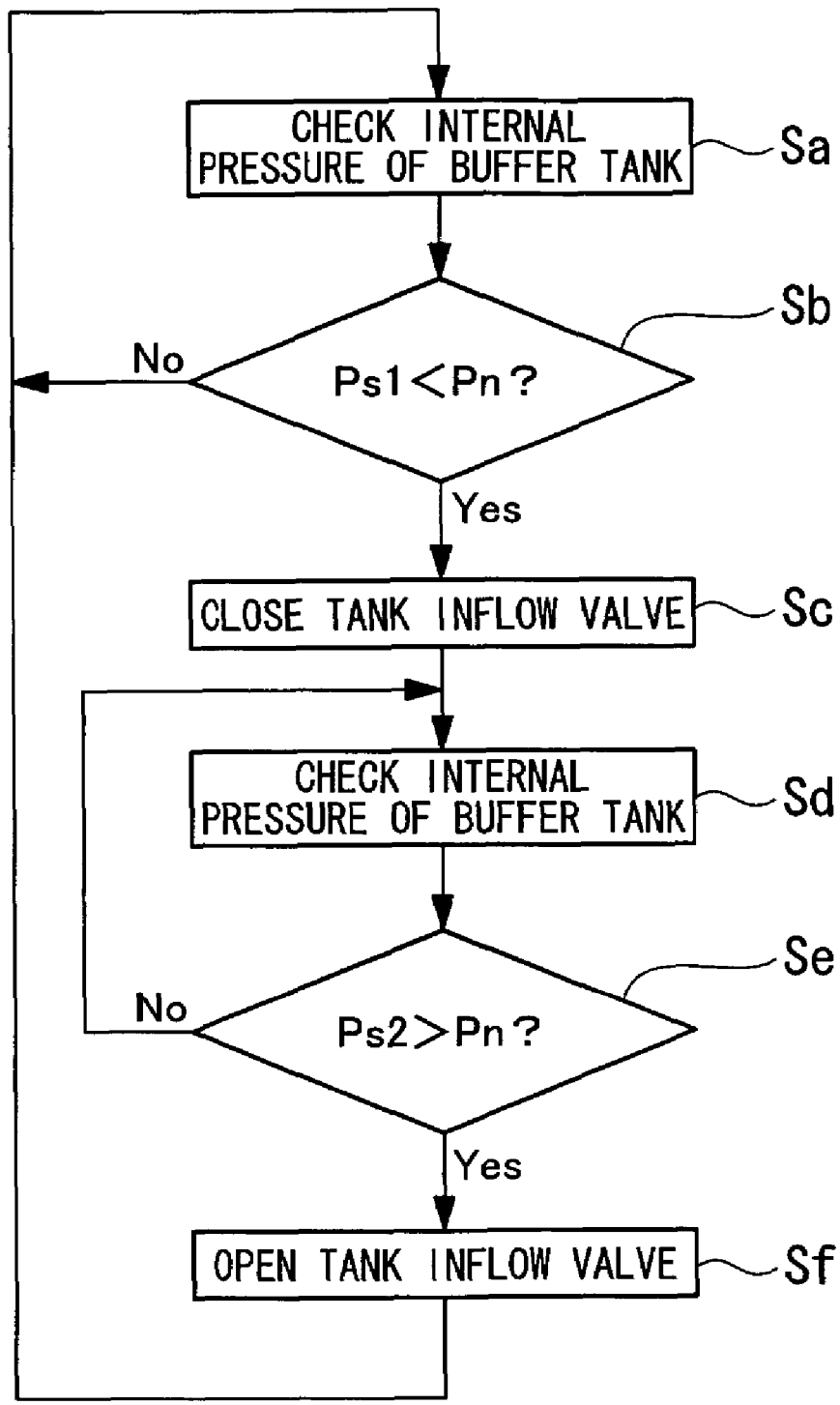
FIG. 4 is a flow chart which shows a sequence for controlling an internal pressure within a buffer tank.

Next, control of the internal pressure within the buffer tank 58 is described. In the buffer tank 58, the basic gas inflow rate and the outflow rate are set so that the combined flow rate of the hydrogen-containing gas and the inert gas which pass through the hydrogen line 53 and the inert gas line 55 making up the inflow side system is larger than the flow rate of the hydrogen mixed gas which passes through the hydrogen mixed gas line 57 making up the outflow side system. Furthermore, the internal pressure within the buffer tank 58 is controlled as shown in the flow chart in FIG. 4.

The buffer tank 58 has a preset pressure range. The upper limit in the present pressure range is called Ps1 and the lower limit is called Ps2. The internal pressure of the buffer tank 58 detected by the buffer tank pressure sensor 60 is Pn. Because the buffer tank 58 is set in such a way that the total flow rate of gas entering the buffer tank 58 is larger than the flow rate of gas leaving the buffer tank 58, the internal pressure of the buffer tank 58 is controlled so as to constantly pressurize the buffer tank.

To this end, the internal pressure within the buffer tank 58 is constantly being checked (step Sa) by the buffer tank pressure sensor 60. If the internal pressure Pn is determined to be higher than the upper limit Ps1 of the preset pressure range (step Sb), the controller outputs control signals to close the tank inflow valves 57a and 57b. And then, the tank inflow valves 57a and 57b close (step Sc), stopping the flows of the hydrogen-containing gas and the inert gas into the buffer tank 58. Because the buffer tank 58 has been in a pressurized state, hydrogen mixed gas continues to flow out from the hydrogen mixed gas line 57 on the outflow side. This causes the internal pressure within the buffer tank 58 to start falling. Even while the tank inflow valves 57a and 57b are closed, the buffer tank pressure sensor 60 continues to check the internal pressure within the buffer tank 58 (step Sd).

Next, when the internal pressure value Pn is determined to have fallen below the lower limit Ps2 of the preset pressure range (step Se), the control unit 13 outputs control signals to re-open the tank inflow valves 57a and 57b. The tank inflow valves 57a and 57b are thus opened (step Sf), allowing the hydrogen-containing gas and the inert gas to flow once again into the buffer tank 58 at preset flow rates. In this way, the interior of the buffer tank 58 is controlled so as to re-pressurize.

By thus providing the buffer tank 58, constantly holding a fixed amount of the hydrogen mixed gas within the buffer tank 58, and controlling the internal pressure of the tank 58 so that the tank is always pressurized within a preset pressure range, during pulling of the silicon single-crystal ingot, even if the flow rates of the hydrogen-containing gas and the inert gas are changed in order to control the hydrogen partial pressure, the buffer tank 58 will function as a pressure adjustment buffering means, making it possible to greatly moderate pressure fluctuations. This is thus very effective for stably pulling a silicon single-crystal ingot because sudden fluctuations do not arise within the chamber even when the hydrogen partial pressure is changed.

The buffer tank 58 can be set to an optimal volume based on various conditions, such as the expected life of the tank inflow valves (typically electromagnetic valves), the required supply rate of the hydrogen mixed gas, and the line pressure before and after the buffer tank 58. The tank 58 may typically be designed to a volume such that the time interval between the opening and closing of the tank inflow valves (electromagnetic valves), that is, the ON/OFF interval, is about 30 minutes. For example, in the case in which the hydrogen mixed gas flow rate is 300 L/min, two outflow mass flow meters are installed, the tank inflow valves (electromagnetic valves) have a lifetime of 100,000 cycles, and the buffer tank inflow side line pressure is 0.5 MPa, the optimal buffer tank volume is about 80 L. When two outflow mass flow meters are installed in series, because the differential pressure in the first outflow mass flow meter is 0.25 to 0.3 MPa, it is preferable to maintain the line pressure between the outflow mass flow meters at 0.15 to 0.25 MPa.

Figure 5:
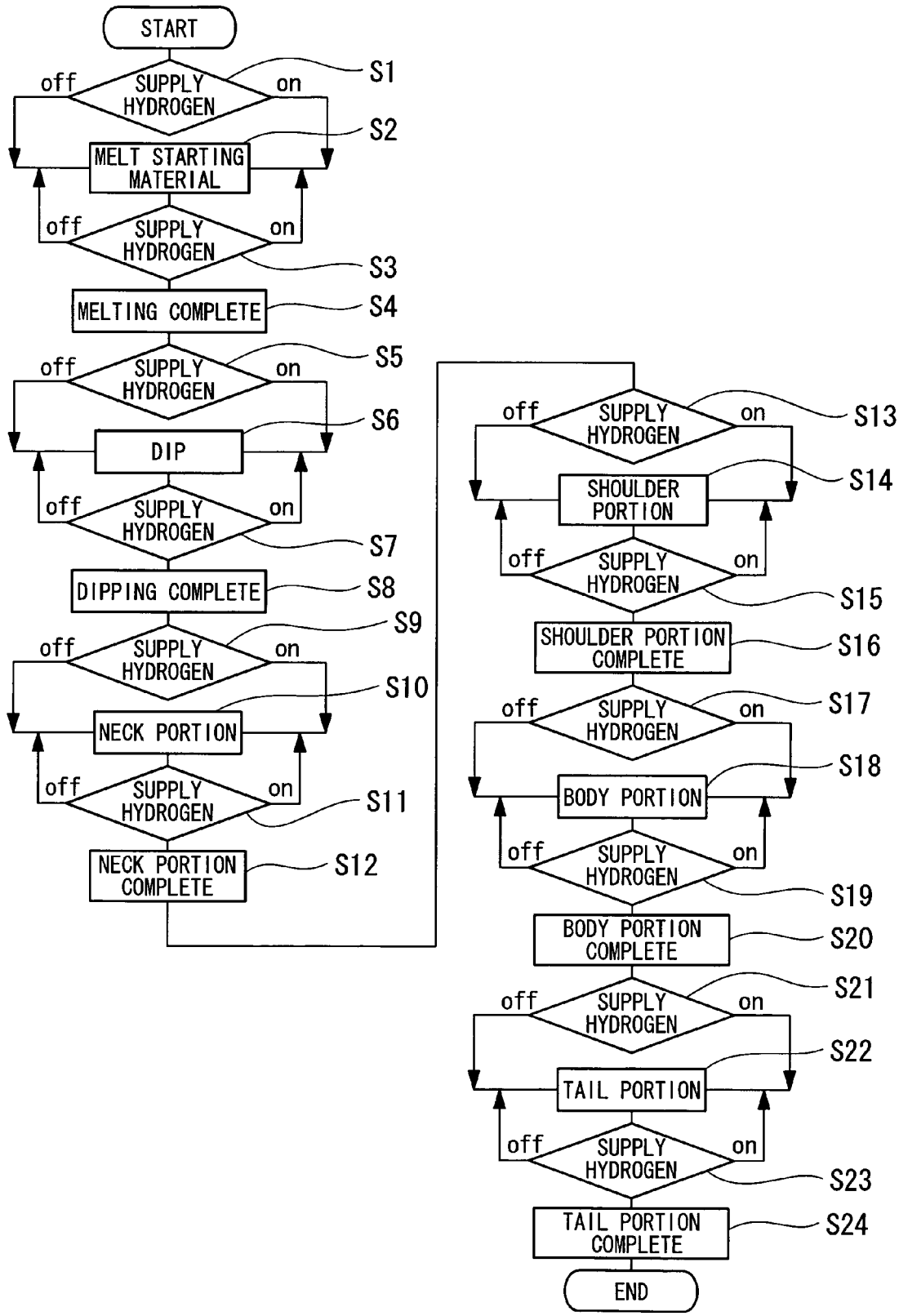
FIG. 5 is a flow chart which illustrates hydrogen supply control in the present invention.

An example of hydrogen-containing gas control according to another embodiment of the present invention is described in conjunction with FIG. 5.

FIG. 5 shows a flow chart which illustrates controls of supplying hydrogen-containing gas in accordance with the crystal length. First, at the start of crystal pulling, the quartz crucible is charged with the silicon starting material and a control to supply or not supply hydrogen-containing gas to the chamber is carried out as shown in step S1, and then the silicon starting material is melted to form a silicon melt as shown in step S2. Next, a control to supply or not supply hydrogen-containing gas during melting of the silicon starting material is carried out as shown in step S3, and melting of the silicon starting material is completed as shown in step S4. By controlling a supply of hydrogen-containing gas when melting the silicon starting material, impurity contamination from members such as the chamber and the heater can be effectively prevented.

Next, the seed crystal is brought into contact with the silicon melt that has been formed in the quartz crucible. While the seed crystal is approached to the silicon melt, a control to supply or not supply hydrogen-containing gas to the chamber is carried out as shown in step S5, and then as shown in step S6, the seed crystal is contacted with the silicon melt in this state. Immediately after the seed crystal has been brought into contact with the melt and crystal growth has been started, a control to supply or not supply hydrogen-containing gas is carried out as shown in step S7 and dipping of the seed crystal is completed as shown in step S8. By thus controlling the supplying of hydrogen-containing gas even during the step in which the seed crystal is dipped into the silicon melt, the flow-regulating action of hydrogen on the silicon melt makes it possible to achieve an effect of preventing dislocation defects in the subsequent step of forming the neck portion and thus creating a defect-free state.

Next, when crystal pulling begins, a control to supply or not supply hydrogen-containing gas to the chamber is carried out as shown in step S9, and then as shown in step S10, the neck portion is pulled in this state. As shown in step S11, a control to supply or not supply hydrogen-containing gas is carried out during pulling of the neck portion as well, and pulling of the neck portion is completed as shown in step S12.

Next, a control to supply or not supply hydrogen-containing gas to the chamber is carried out as shown in step S13, and then as shown in step S14, the shoulder portion is pulled in this state. As shown in step S15, a control to supply or not supply hydrogen-containing gas is carried out during pulling of the shoulder portion as well, and pulling of the shoulder portion is completed as shown in step S16.

Next, a control to supply or not supply hydrogen-containing gas to the chamber is carried out as shown in step S17, and then as shown in step S18, the body portion is pulled in this state. As shown in step S19, a control to supply or not supply hydrogen-containing gas is carried out during pulling of the body portion as well, and pulling of the body portion is completed as shown in step S20.

Next, a control to supply or not supply hydrogen-containing gas to the chamber is carried out as shown in step S21, and then as shown in step S22, the tail portion is pulled in this state. As shown in step S23, a control to supply or not supply hydrogen-containing gas is carried out during pulling of the tail portion as well, and pulling of the tail portion is completed as shown in step S24.

Pulling of the single crystal is then brought to completion. By carrying out control in this way, it is possible to obtain a single crystal like that described.

EXAMPLES

To confirm the operation and advantageous effects of the present invention, we carried out Examples 1 and 2 below using an apparatus for manufacturing a semiconductor single crystal of the present invention like that described above to manufacture silicon crystal ingots.

In Example 1, a silicon crystal was pulled using a crystal growing apparatus having a hot zone capable of manufacturing a 300 mm silicon crystal free of grown-in defects and dislocations. Specifically, crystal growing was carried out with a crystal growing apparatus having a hot zone structure in which an axial temperature gradient Gc from the melting point to 1350° C. at a center of the crystal was 3.2° C./mm, the axial temperature gradient Ge from the melting point to 1350° C. at an outer circumference of the crystal was 2.2° C./mm, and a ratio of Gc/Ge was 1.3. During growth of the crystal, a horizontal magnetic field having a field strength of 3,000 G was applied at a magnetic field center height of 0 mm with respect to the liquid surface of the melt.

A hydrogen/argon mixed gas was obtained by direct mixing from a hydrogen gas line and an argon line in the immediate vicinity of the furnace, then was passed through a mixed gas agitator (static mixer) and was subsequently supplied to the furnace. Hydrogen gas was supplied only for the body portion of the crystal; the crystal was grown while varying this hydrogen gas flow rate from 3 to 24 L/min. Hydrogen gas was supplied at a hydrogen partial pressure of 40 Pa for a portion of the crystal from a crystal length of 0 to 200 mm (Block 1), at a hydrogen partial pressure of 120 Pa for a portion of the crystal from a crystal length of 200 to 300 mm (Block 2), and at a hydrogen partial pressure of 240 Pa for a portion of the crystal at a crystal length greater than 300 mm (Block 3).

Aside from hydrogen partial pressure control, Example 2 was carried out under the same crystal growing conditions as in Example 1. In this example, hydrogen gas was supplied at a hydrogen partial pressure of 40 Pa for the portion of the crystal from a crystal length of 0 to 200 mm (Block 1), at a hydrogen partial pressure of 320 Pa for the portion of the crystal from a crystal length of 200 to 300 mm (Block 2), and at a hydrogen partial pressure of 240 Pa for the portion of the crystal at a crystal length greater than 300 mm (Block 3).

In a Comparative Example, crystal pulling was carried out by a prior-art method in which the hydrogen partial pressure during crystal growth was held constant at 240 Pa, thereby manufacturing a single-crystal ingot.

Blocks 1 to 3 were removed from the respective ingots obtained in Examples 1 and 2 according to the present invention and in the Comparative Example. Each of the blocks was vertically sectioned along a pull axis so as to fabricate plate-like test pieces containing a region near the pull axis. Copper decoration was then carried out so as to examine a distribution of grown-in defects. First, each test piece was immersed in an aqueous solution of copper sulfate, then air-dried and subsequently heat treated in a nitrogen atmosphere at 900° C. for about 20 minutes. Next, in order to remove a copper silicide layer at a surface of the test piece, the test piece was immersed in an HF/HNO$_3$ mixed solution and several tens of microns of material at the surface layer was etched away, and then a position of an OSF ring and the distribution of the respective defect regions were examined by x-ray topography. Also, the COP density in this sliced piece was examined by the OPP method, and a dislocation cluster density was examined by the Secco etching method. Based on results thus obtained, the crystal length that can be used as finished product or monitor wafers was computed, and the ratio of this crystal length to the full crystal length was determined.

The results are shown in Table 2.

TABLE 2

| | Block 1 | Block 2 | Block 3 | Crystal yield |
| --- | --- | --- | --- | --- |
| Example 1 | 40 | 120 | 240 | 60% |
| Example 2 | 40 | 320 | 240 | 75% |
| Comparative Example | 120 | 240 | 240 | 50% |

It is apparent from Table 2 that the silicon single crystals manufactured in Examples 1 and 2 according to the present invention both had greatly improved yields compared with the Comparative Example according to the prior-art. These results confirm the advantageous effects of the present invention.

As described in detail above, the apparatus for manufacturing a semiconductor single crystal of the present invention can easily control the hydrogen atom concentration in a hydrogen mixed gas in response to changes in the semiconductor single crystal pulling environment and moreover is capable of supplying such a hydrogen mixed gas continuously and stably over an extended period of time with a low-cost apparatus.

What is claimed is:

1. An apparatus for manufacturing a semiconductor single crystal, the apparatus comprising:

a crucible for holding a semiconductor melt;

a heater for heating the crucible;

a crucible driving unit for rotating and/or vertically moving the crucible;

a chamber for housing the crucible and the heater; and a hydrogen mixed gas supplying device for supplying into the chamber a hydrogen mixed gas including an inert gas in admixture with a hydrogen-containing gas that contains hydrogen atoms, wherein the hydrogen mixed gas supplying device comprises:

a hydrogen-containing gas supply unit for supplying the hydrogen-containing gas that contains hydrogen atoms;

an inert gas supply unit for supplying the inert gas;

a hydrogen-containing gas flow rate controller for controlling a flow rate of the hydrogen-containing gas supplied by the hydrogen-containing gas supply unit;

an inert gas flow rate controller for controlling a flow rate of the inert gas supplied by the inert gas supply unit; and a buffer tank for mixing together the hydrogen-containing gas and the inert gas that flow respectively from the hydrogen-containing gas flow rate controller and the inert gas flow rate controller so as to form a hydrogen mixed gas and for holding the hydrogen mixed gas.

2. The apparatus for manufacturing a semiconductor single crystal according to claim 1, wherein the semiconductor melt is a silicon melt and the semiconductor single crystal is a silicon single crystal.

3. The apparatus for manufacturing a semiconductor single crystal according to claim 1, wherein the buffer tank is equipped with a buffer tank pressure sensor for detecting an internal pressure within the tank.

4. The apparatus for manufacturing a semiconductor single crystal according to claim 1, wherein the buffer tank is equipped with a tank inflow valve on an inflow side thereof.

5. The apparatus for manufacturing a semiconductor single crystal according to claim 4, wherein in the buffer tank, a total flow rate on the inflow side is set higher than a total flow rate on an outflow side, and when an internal pressure within the buffer tank exceeds an upper limit value in a preset pressure range, a control is carried out so as to close the tank inflow valve until the internal pressure within the tank falls to at least a lower limit value in the preset pressure range.

6. The apparatus for manufacturing a semiconductor single crystal according to claim 1, which further comprises a chamber internal pressure detecting unit for detecting an internal pressure within the chamber, and wherein the flow rate of the hydrogen-containing gas allowed by the hydrogen-containing gas flow rate controller is controlled in accordance with an internal pressure value within the chamber detected by the chamber internal pressure detecting unit.

7. The apparatus for manufacturing a semiconductor single crystal according to claim 1, which further comprises a semiconductor single crystal pull rate detecting unit for detecting a pull rate of the semiconductor single crystal being pulled from the semiconductor melt, and wherein the flow rate of the hydrogen-containing gas allowed by the hydrogen-containing gas flow rate controller is controlled in accordance with a pull rate value for the semiconductor single crystal.

8. The apparatus for manufacturing a semiconductor single crystal according to claim 1, which further comprises a semiconductor single crystal length detecting unit for detecting a length of the semiconductor single crystal already pulled from the semiconductor melt, and wherein the flow rate of the hydrogen-containing gas allowed by the hydrogen-containing gas flow rate controller is controlled in accordance with the length of the pulled semiconductor single crystal.

9. The apparatus for manufacturing a semiconductor single crystal according to claim 1, wherein the inert gas includes at least argon as a primary component.

10. The apparatus for manufacturing a semiconductor single crystal according to claim 1, wherein the hydrogen-containing gas supply unit includes a hydrogen-containing gas purification equipment for purifying a starting gas containing hydrogen atom.

11. The apparatus for manufacturing a semiconductor single crystal according to claim 1, wherein the inert gas supply unit includes an inert gas purification equipment for purifying a starting gas containing inert gas.

12. The apparatus for manufacturing a semiconductor single crystal according to claim 1, wherein the hydrogen mixed gas supplying device has a plurality of hydrogen mixed gas supply lines for supplying the hydrogen mixed gas to a plurality of chambers.

13. The apparatus for manufacturing a semiconductor single crystal according to claim 1, wherein at least an inner wall of the chamber is made of a material that is resistant to hydrogen corrosion.

* * * * *